(12) United States Patent
Lee et al.

(10) Patent No.: US 7,808,248 B2
(45) Date of Patent: Oct. 5, 2010

(54) RADIO FREQUENCY TEST KEY STRUCTURE

(75) Inventors: Yue-Shiun Lee, Taipei (TW);
Cheng-Hsiung Chen, Taipei (TW);
Tsz-Hui Kuo, Hsinchu (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 548 days.

(21) Appl. No.: 11/538,816

(22) Filed: Oct. 5, 2006

(65) Prior Publication Data

US 2008/0083922 A1    Apr. 10, 2008

(51) Int. Cl.
*G01R 31/02* (2006.01)
*G01R 31/26* (2006.01)
*H01L 23/58* (2006.01)
*H01L 21/66* (2006.01)

(52) U.S. Cl. ............... 324/537; 324/755; 324/765; 257/48; 438/14; 438/17; 438/18

(58) Field of Classification Search ................ 324/537, 324/754, 765; 257/48; 438/14, 17, 18
See application file for complete search history.

(56) References Cited

U.S. PATENT DOCUMENTS

| 5,942,766 | A | * | 8/1999 | Frei | 257/48 |
| 6,194,739 | B1 | * | 2/2001 | Ivanov et al. | 257/48 |
| 6,878,964 | B1 | * | 4/2005 | Lien et al. | 257/48 |
| 7,126,359 | B2 | * | 10/2006 | Huang et al. | 324/754 |

FOREIGN PATENT DOCUMENTS

| TW | 363238 | 7/1999 |
| TW | I232528 | 5/2005 |

* cited by examiner

*Primary Examiner*—Timothy J Dole
(74) *Attorney, Agent, or Firm*—Winston Hsu; Scott Margo; Min-Lee Teng

(57) ABSTRACT

A radio frequency test key structure includes a substrate, a bottom metal layer and a top metal layer. A narrow testing region is defined on the substrate. The bottom metal layer is positioned on the substrate and in the narrow testing region, and including an opening to expose parts of a device under test. The top metal layer is a metal pad in a sheet form, positioned in the narrow testing region and on the bottom metal layer. At least two signal pad regions and at least two ground pad regions are defined in the top metal layer. The signal pad regions and the ground pad regions are arranged in one row, and the row is parallel to the narrow testing region. Accordingly, the radio frequency test key structure can be positioned in a scribe line, and get an accurate testing result.

24 Claims, 6 Drawing Sheets

RADIO FREQUENCY TEST KEY STRUCTURE

BACKGROUND OF THE INVENTION

1. Field of the Invention

The present invention relates to a radio frequency (RF) test key structure, and more particularly, to a RF test key structure that can be set in a scribe line.

2. Description of the Prior Art

Due to the rapid development of wireless communication systems, wireless devices offering great convenience are widely used in daily communications. With wireless devices, people are able to exchange information, share experiences, and communicate with each other anytime and anywhere.

Because of the wide usage of wireless devices, more various and new wireless products are developed. In wireless product fabrication, a RF device should continuously be tested during manufacturing to maintain the quality of the products. A plurality of test keys should be formed in the scribe line between two dies or on a surface of a monitor wafer. That is, as the semiconductor processes are performed, a testing device should be formed in the scribe line area utilizing the same processes at the same time for simulation. The parameters of the processes are measured by utilizing a metal probe to contact the test keys, and those parameters are important indexes used to indicate the reliability of products. As a result, a variety of defects in the semiconductor processes are monitored, and the quality of the actual device therefore is well controlled.

Please refer to FIG. 1. FIG. 1 is a schematic diagram of a traditional RF test key structure. As shown in FIG. 1, the RF test key structure 10 includes a substrate 12, a bottom metal layer and a top metal layer. The substrate 12 further includes a device under test (DUT) 18, such as a metal-oxide semiconductor (MOS). The DUT 18 includes four connecting terminals 182, 184, 186, 188. According to the figure, the four connecting terminals 182, 184, 186, 188 are a gate connecting terminal 182 in the front, a source connecting terminal 184 to the right, a drain connecting terminal 186 in the rear and a substrate connecting terminal 188 to the left respectively. The gate connecting terminal 182 is electrically connected to a gate of the DUT 18, the source connecting terminal 184 is electrically connected to a source of the DUT 18, the drain connecting terminal 186 is electrically connected to a drain of the DUT 18, and the substrate connecting terminal 188 is electrically connected to the substrate of the DUT 18. The bottom metal layer consists of a front portion 142, a right portion 144, a rear portion 146 and a left portion 148. The front portion 142, the right portion 144, the rear portion 146 and the left portion 148 surround the DUT 18 at the four edges of the DUT 18. A front signal pad 14a and a rear signal pad 14b are defined in the front portion 142 and in the rear portion 146 respectively for electrically connecting to the probes.

The top metal layer is positioned on the bottom metal layer, and a dielectric layer (not shown in the figure) is included between the top metal layer and the bottom metal layer. The top metal layer comprises a right piece 164 and a left piece 168. Utilizing a plurality of via plugs that pass through the dielectric layer, the right piece 164 and the left piece 168 are electrically connected to the right portion 144 and the left portion 148 of the bottom metal layer respectively. The right piece 164 and the left piece 168 both are narrow metal pieces parallel to a first direction 1. A ground pad 164a and a ground pad 164b are defined in the front of the right piece 164 and in the rear of the right piece 164 respectively, and a ground pad 168a and a ground pad 168b are defined in the front of the left piece 168 and in the rear of the right piece 168. As a result, the ground pad 168a, the front signal pad 14a and the ground pad 164a are arranged in one front row region, and the front row region is perpendicular to the first direction 1. The ground pad 168b, the rear signal pad 14b and the ground pad 164b are arranged in one rear row region, and the rear row region is also perpendicular to the first direction 1. Accordingly, the probes of a probe card can contact the front row region and the rear row region of the RF test key structure 10 respectively to test the DUT 18.

However, the designed structure of the traditional RF test key structure 10 is too wide to be set in a scribe line, and it increases the difficulty of manufacturing and testing. Therefore, a prior art RF test key structure positioned in a scribe line is provided. Please refer to FIG. 2. FIG. 2 is a schematic diagram of a prior art RF test key structure. As shown in FIG. 2, the RF test key structure 20 includes a substrate 22, at least four metal connecting lines 242, 244, 246, 248 and six rectangular metal pads 261, 262, 263, 264, 265, 266. The substrate 22 further includes a device under test (DUT) 28, and the DUT 28 includes a gate connecting terminal 282, a source connecting terminal 284, a drain connecting terminal 286 and a substrate connecting terminal 288 respectively. The gate connecting terminal 282 is electrically connected to a gate of the DUT 28, the source connecting terminal 284 is electrically connected to a source of the DUT 28, the drain connecting terminal 286 is electrically connected to a drain of the DUT 28, and the substrate connecting terminal 288 is electrically connected to the substrate of the DUT 28. The metal connecting lines 242, 244, 246, 248 and the rectangular metal pads 261, 262, 263, 264, 265, 266 are formed by multilevel interconnect processes. The six rectangular metal pads 261, 262, 263, 264, 265, 266 are arranged in one row, and the row is set in and parallel to a scribe line region 30. The six rectangular metal pads 261, 262, 263, 264, 265, 266 are a ground pad 261, a signal pad 262, a ground pad 263, a ground pad 264, a signal pad 265, and a ground pad 266 from left to right for electrically connecting to the probes. The metal connecting line 242 electrically connects the signal pad 262 and the gate connecting terminal 282, the metal connecting line 244 electrically connects the ground pad 266 and the source connecting terminal 284, the metal connecting line 246 electrically connects the signal pad 265 and the drain connecting terminal 286, and the metal connecting line 248 electrically connects the ground pad 261 and the substrate connecting terminal 288.

The conventional RF test key structure 20 utilizes the threadlike metal connecting line for electrically connecting. Since the electric resistance of a conductor is inversely proportional to its cross-sectional area, the threadlike metal connecting line obviously increases the inner resistance of the RF test key structure 20, and leads to a great difference between the testing data of the RF test key structure 20 and a testing data of the actual RF device. As a result, even if the RF test key structure 20 can be set in the scribe line region 30, it cannot actually reflect the electronic characteristic of the RF device, and the RF test key structure 20 therefore fails in the accuracy.

SUMMARY OF THE INVENTION

It is therefore an objective of the present invention to provide a RF test key structure to solve the above-mentioned problem, and increase the accuracy of the RF test key structure.

According to claims of the present invention, a RF test key structure positioned in a scribe line region includes a substrate, a device under test and at least two metal layers in a scribe line region is provided. At least a scribe line region is defined in the substrate. The device under test is positioned in the scribe line region on the substrate, and comprises at least two signal connecting terminals and at least two ground connecting terminals. The metal layers are positioned in the scribe line region, comprises a bottom metal layer positioned on the substrate and a top metal layer positioned on the bottom metal layer. The top metal layer is a metal pad in a sheet form. At least two signal pad regions and at least two ground pad regions are defined in the top metal layer. The signal pad regions are electrically connected to the signal connecting terminals of the device under test, and the ground pad regions are electrically connected to the ground connecting terminals of the device under test. The signal pad regions and the ground pad regions are arranged in one row parallel to the scribe line region. The top metal layer comprises at least an insulating opening between the signal pad regions and the ground pad regions and between the two signal pad regions so as to separate the signal pad regions from the ground pad regions and to separate the signal pad regions from each other.

Because the signal pad regions and the ground pad regions in the RF test key structure of the present invention are arranged in one row parallel to the scribe line region, the RF test key structure can be set in the scribe line region. Furthermore, the top metal layer and the bottom metal layer of the RF test key structure both are metal layers with large areas, so they can provide great electromagnetic interference shielding, protect the RF test key structure from the outer RF interference, and increase the accuracy of the RF test key structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
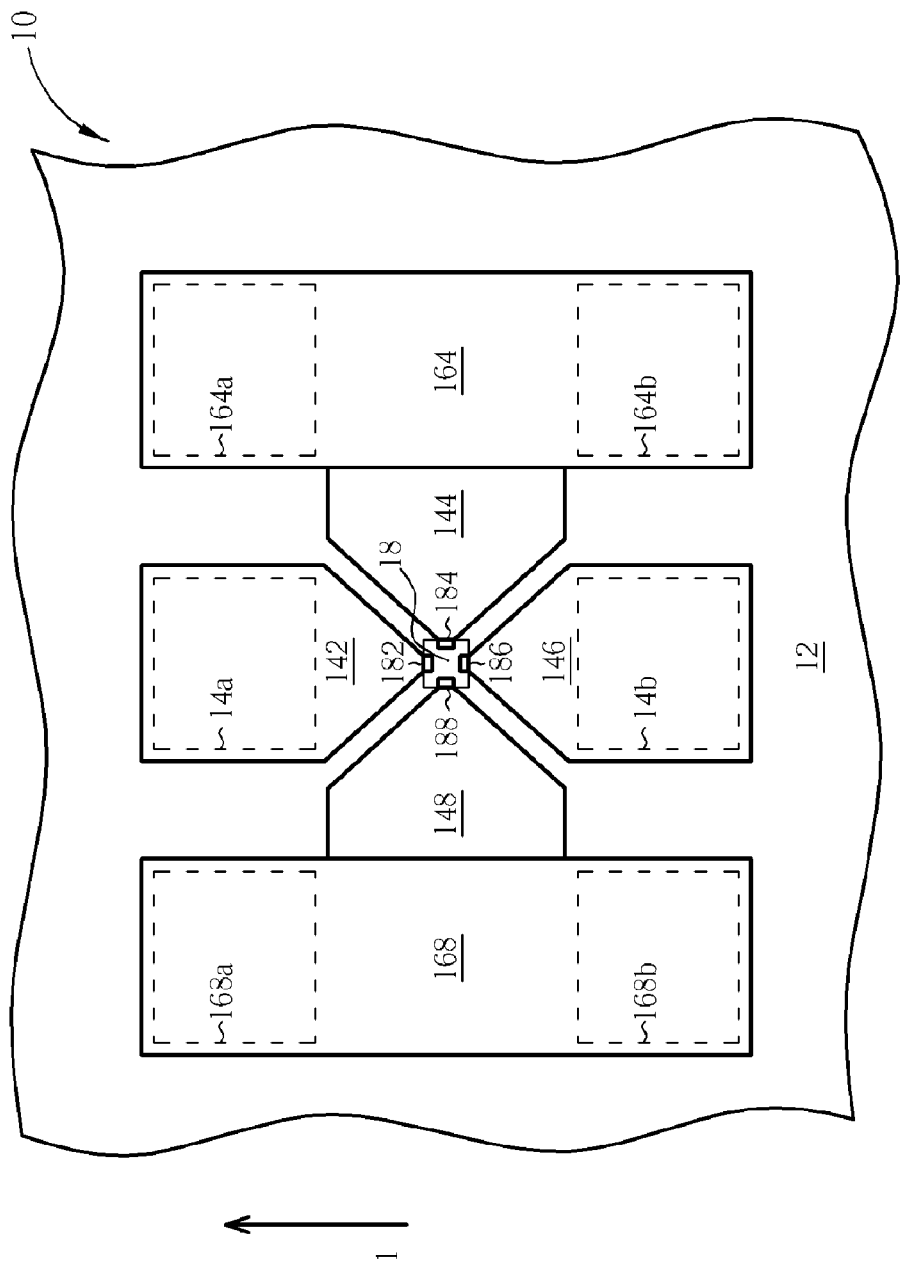
FIG. 1 is a schematic diagram of a traditional RF test key structure.
Figure 2:
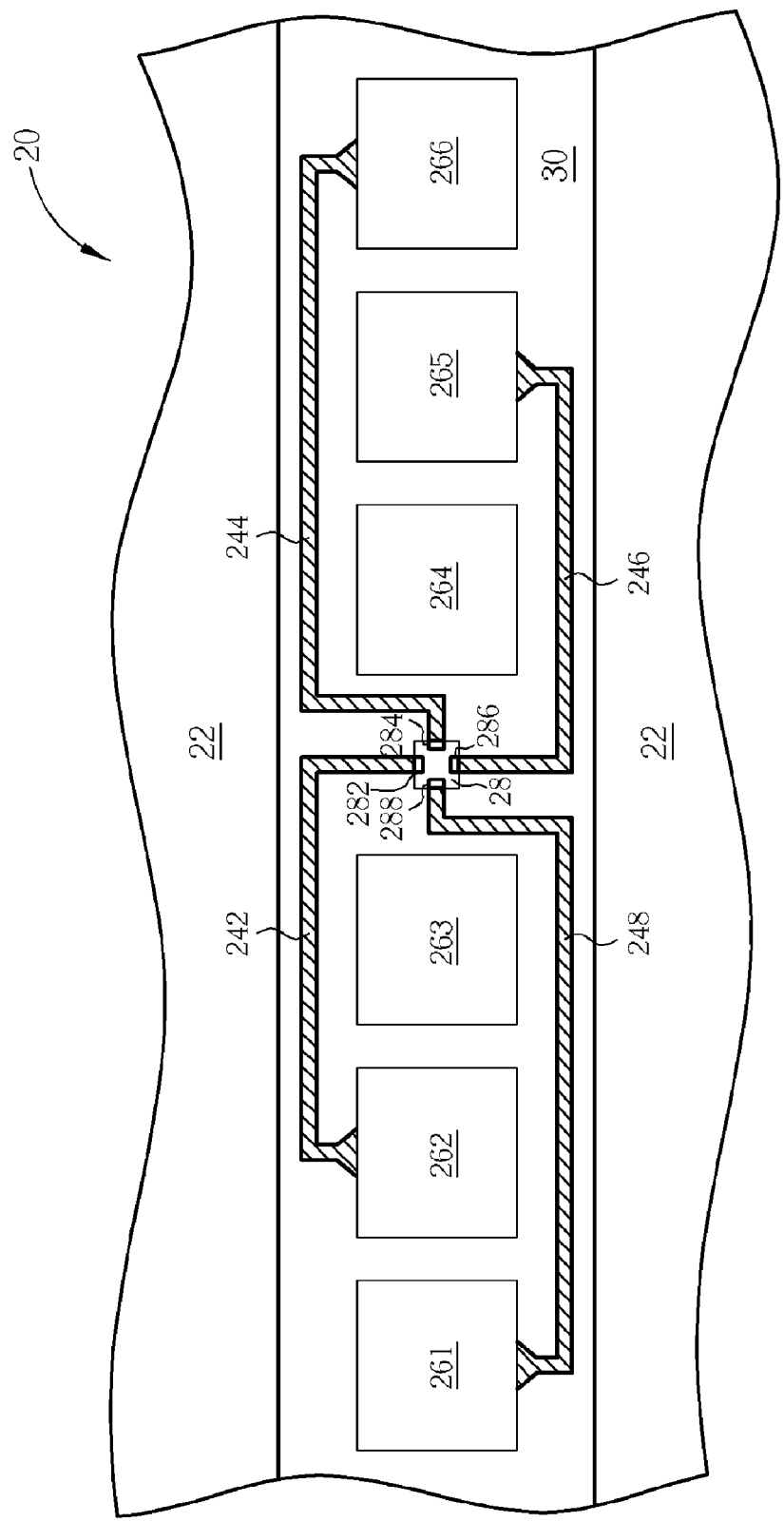
FIG. 2 is a schematic diagram of a prior art RF test key structure.
Figure 3:
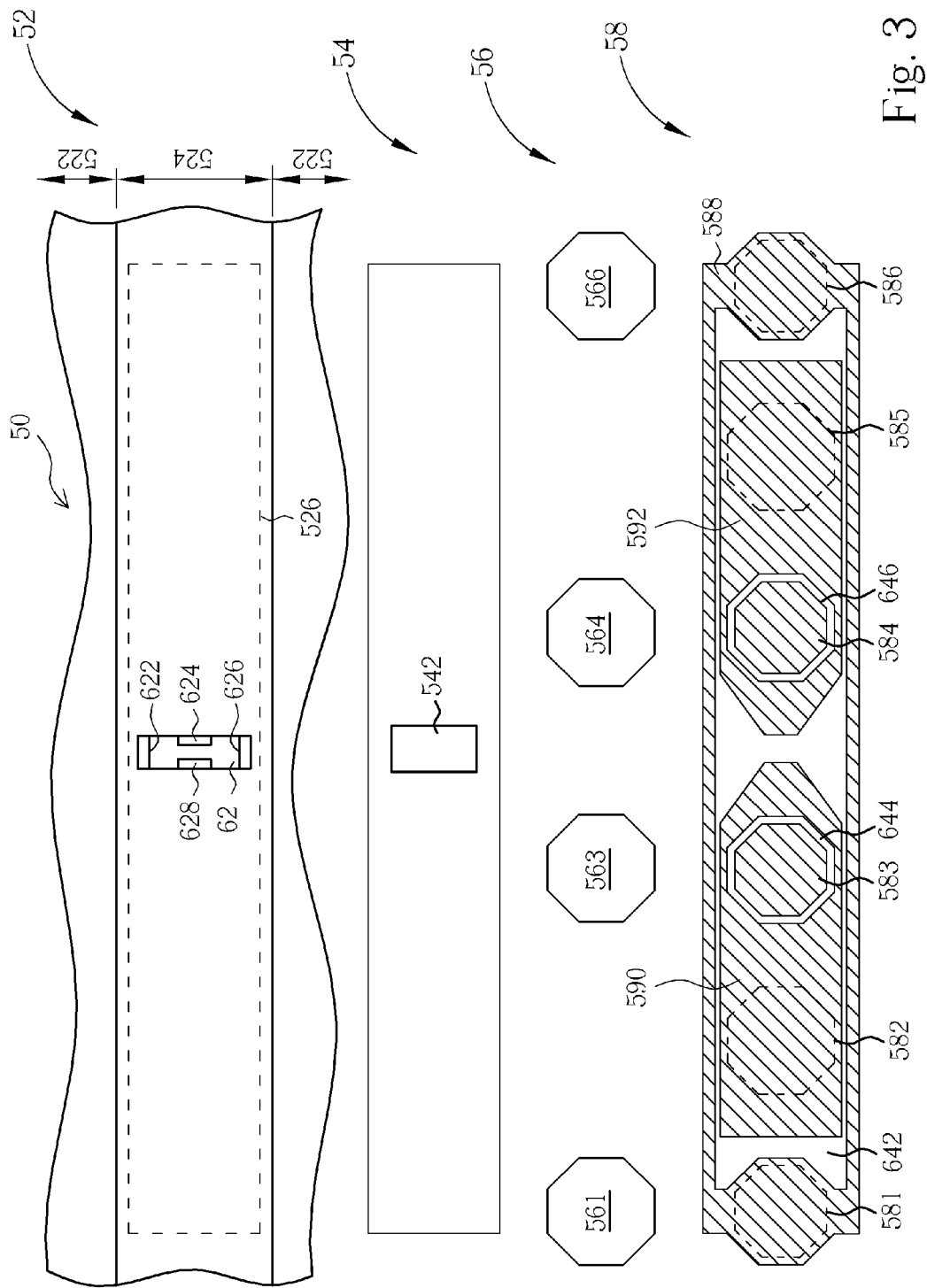
FIG. 3 illustrates a schematic diagram of a layout of a RF test key structure according to a first preferred embodiment of the present invention.
Figure 4:
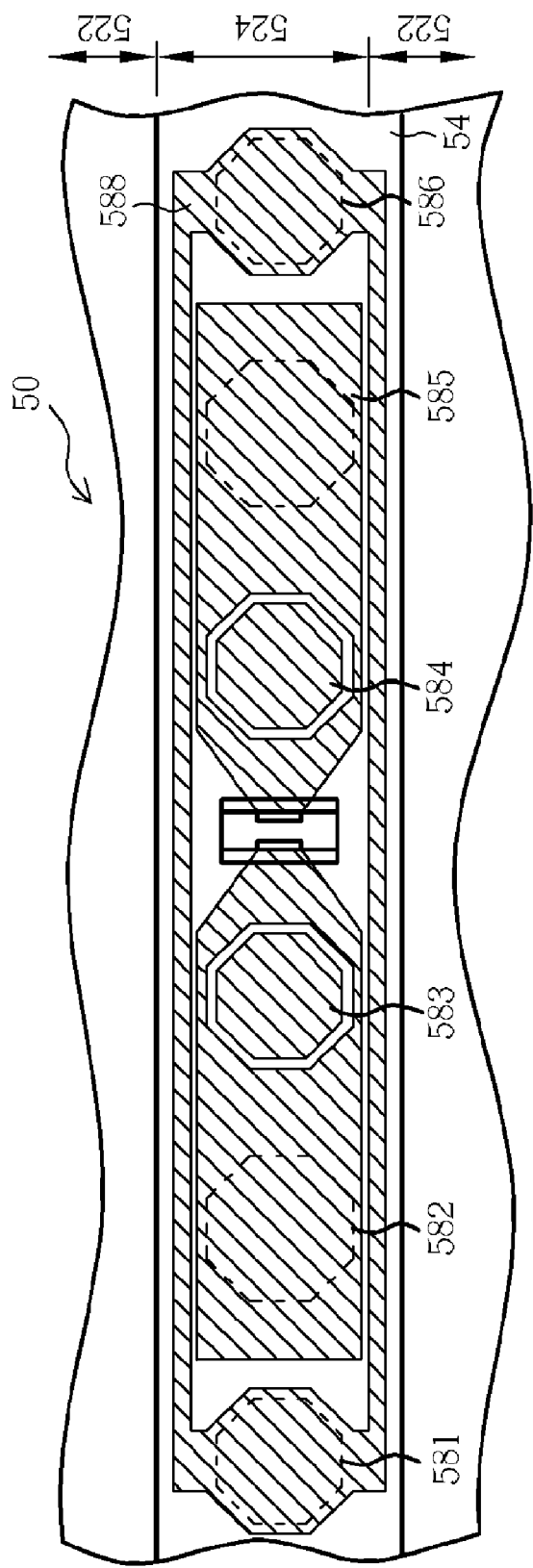
FIG. 4 is a schematic top view of the RF test key structure in FIG. 3.

Please refer to FIG. 3 and FIG. 4. FIG. 3 illustrates a schematic diagram of a layout of a RF test key structure according to a first preferred embodiment of the present invention, and FIG. 4 is a schematic top view of the RF test key structure in FIG. 3. As shown in FIG. 3 and FIG. 4, the RF test key structure 50 from bottom to top includes a substrate 52, a bottom metal layer 54, at least an inner metal layer 56 and a top metal layer 58. The substrate 52 can be a semiconductor wafer including polysilicon or doped polysilicon. For example, the substrate 52 can be a part of a wafer, a silicon-on-insulator (SOI), or strained silicon. A plurality of die regions 522 and at least a scribe line region 524 between the die regions 522 are defined in the substrate 52. A narrow testing region 526 is defined in the scribe line region 524 of the substrate 52, and is set as a predetermined position for the RF test key structure 50.

The narrow testing region 526 of the substrate 52 can further include a device under test (DUT) 62. In the first preferred embodiment, the DUT 62 can be a RF component, such as a MOS transistor or an equivalent circuit of a MOS transistor. The DUT 62 includes four connecting terminals 622, 624, 626, 628. According to the figure, the four connecting terminals 622, 624, 626, 628 are a ground connecting terminal 622 in the front, a signal connecting terminal 624 to the right, a ground connecting terminal 626 in the rear and a signal connecting terminal 628 to the left. The ground connecting terminal 622 is electrically connected to a source of the DUT 62, the signal connecting terminal 624 is electrically connected to a drain of the DUT 62, the ground connecting terminal 626 is electrically connected to the substrate of the DUT 62, and the signal connecting terminal 628 is electrically connected to a gate of the DUT 62.

The bottom metal layer 54, which can be electrically connected to a ground point (not shown in the figure), is substantially a narrow rectangular metal piece positioned in the narrow testing region 526 on the substrate 52. The bottom metal layer 54 includes a containing opening 542 to expose the signal connecting terminal 624 and the signal connecting terminal 628 of the DUT 62. Furthermore, the bottom metal layer 54 contacts the ground connecting terminal 622 and the ground connecting terminal 626 so as to electrically connect to the source of the DUT 62 and the substrate 52.

The top metal layer 58 is a metal pad in a sheet form, and substantially a narrow rectangular metal piece positioned in the narrow testing region 526 on the bottom metal layer 54. In the first preferred embodiment, two signal pad regions 582, 585 and four ground pad regions 581, 583, 584, 586 are defined in the top metal layer 58, and arranged in one row parallel to the narrow testing region 526. A ground pad region 581, a signal pad region 582, a ground pad region 583, a ground pad region 584, a signal pad region 585, and a ground pad region 586 arranged from left to right (G-S-G-G-S-G) for electrically connecting to the testing probes. Discriminating by the relative position, the ground pad regions 581, 586 are central ground pad regions, and the ground pad regions 583, 584 are marginal ground pad regions. Please note that the octagonal signal pad regions 582, 585 and the octagonal ground pad regions 581, 583, 584, 586 are taken as an example in the first preferred embodiment, but the shape is not limited to being octagonal. The shapes of the signal pad regions 582, 585 and the ground pad regions 581, 583, 584, 586 can be any geometric shape, such as rectangles, hexagons, octagons, or circles, and any geometric shape of pad region should be included according to the spirit of this present invention. The more similar the pad regions are to a circular shape, the better electrical characteristic these pad regions get.

The top metal layer 58 comprises at least an insulating opening between the signal pad regions 582, 585 and the ground pad regions 581, 583, 584, 586 and between the two signal pad regions 582, 585 so as to separate the signal pad regions 582, 585 from the ground pad regions 581, 583, 584, 586 and to separate the signal pad regions 582, 585 from each other. For instance, the top metal layer 58 includes a first insulating opening 642 that surrounds the signal pad regions 582, 585 and the central ground pad regions 583, 584, and crosses in a position between the central ground pad regions 583, 584. As a result, the fist insulating opening 642 can electrically separate the ground pad region 581 from the signal pad region 582, electrically separate the ground pad region 581 from the signal pad region 585, electrically separate the ground pad region 586 from the signal pad region 582, and electrically separate the ground pad region 586 from the signal pad region 585 in the top metal layer 58. As shown in the figure, the first insulating opening 642 preferably separates the top metal layer 58 into three independent proportions, including an outside portion 588, an inner left portion 590, and an inner right portion 592. The outside portion 588 forms a frame-like structure surrounding the two inner portions 590/592, in which the portions 590/592 are separated by a distance. The ground pad region 581 and the ground pad region 586 are electrically connected to each other through the frame structure 588, such that the shape of the signal pad regions 582, 585 adjacent to the DUT 62 would gradually expand from the DUT 62 toward the other end. In addition, the top metal layer 58 further includes a second insulating opening 644 and a third insulating opening 646. The second insulating opening 644 surrounds the ground pad region 583 to electrically separate the ground pad region 583 from the signal pad region 582 in the top metal layer 58. The third insulating opening 646 surrounds the ground pad region 584 to electrically separate the ground pad region 584 from the signal pad region 585 in the top metal layer 58.

As a result, the signal pad region 582 and the signal pad region 585 can electrically connect to the signal connecting terminal 624 and the signal connecting terminal 628 of the DUT 62 respectively through the top metal layer 58 having large area without electrically connecting to the ground pad regions 581, 583, 584, 586. Accordingly, without any thread-like winding metal connecting line, the testing data of the RF test key structure 50 don't diverge from the electrical characteristic of the DUT 62. It should be noted that parts of the top metal layer 58 adjacent to the DUT 62 get narrow gradually from an edge of the top metal layer 58 to the DUT 62, and not narrow sharply. If the cross-sectional area of the top metal layer 58 decreases sharply, a resistance value of an RF test key structure increases, and an accuracy of the RF test key structure decreases. In other words, because parts of the top metal layer 58 adjacent to the DUT 62 get narrow gradually, the present invention increases the accuracy of the RF test key structure 50 in test.

At least an inner metal layer 56 can be included between the bottom metal layer 54 and the top metal layer 58. The number of the inner metal layers 56 and the structure of the inner metal layers 56 can be determined by the design of product dies or the characteristic of the DUT 62. For instance, the higher frequency the DUT 62 should operate on, the more the inner metal layers 56 should be. Accordingly, dielectric layers can be included between the bottom metal layer 54, the inner metal layers 56 and the top metal layer 58 so as to prevent these metal layers from electrically contacting to each other. Take one inner metal layer 56 for example, a piece 561, a piece 563, a piece 564 and a piece 566 are included in the inner metal layer 56, and corresponding to the ground pad region 581, the ground pad region 583, the ground pad region 584 and the ground pad region 586 of the top metal layer 58 respectively. Above the inner metal layers 56, the piece 561, the piece 563, the piece 564 and the piece 566 are electrically connected to the ground pad region 581, the ground pad region 583, the ground pad region 584 and the ground pad region 586 of the top metal layer 58 respectively through a plurality of via plugs (not shown in the figure) that pass through the dielectric layers (not shown in the figure). Below the inner metal layers 56, the piece 561, the piece 563, the piece 564 and the piece 566 are electrically connected to the bottom metal layer 54 through a plurality of via plugs (not shown in the figure) that pass through the dielectric layers (not shown in the figure).

Figure 5:
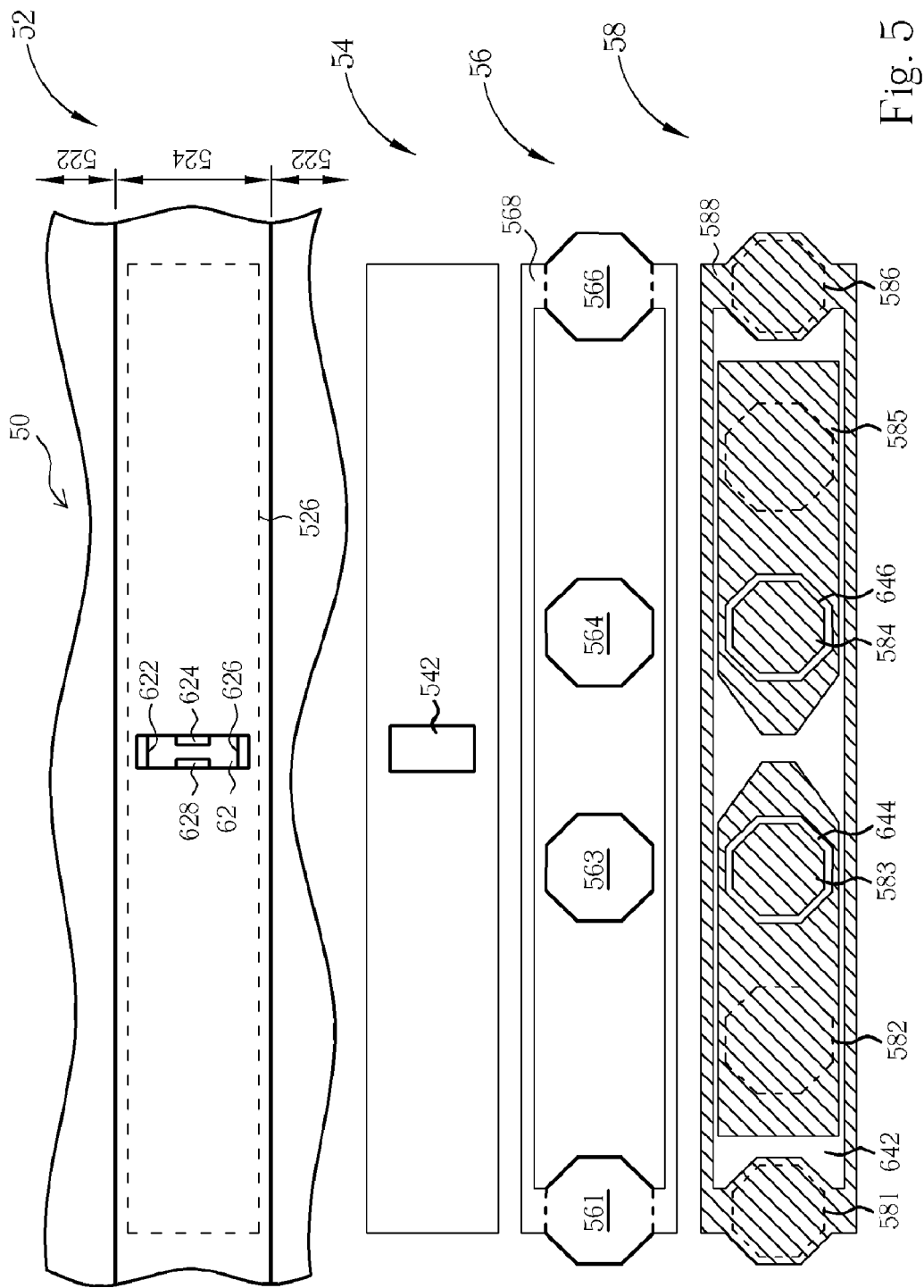
FIG. 5 illustrates a schematic diagram of a layout of a RF test key structure according to a second preferred embodiment of the present invention.

Besides the piece 561, the piece 563, the piece 564 and the piece 566, the inner metal layer 56 can further include a frame. As shown in the second preferred embodiment of the present invention in the FIG. 5, a frame 568 is set corresponding to the frame structure 588 of the top metal layer 58, which provides better electromagnetic interference shielding and better protection for the RF test key structure 50. The piece 561, the piece 563, the piece 564, the piece 566 and the frame 568 can be made of metal.

Thereafter, the signal pad region 582 and the signal pad region 585 can be electrically connected to the signal connecting terminal 624 and the signal connecting terminal 628 of the DUT 62 respectively through the top metal layer 58, and the ground pad region 581, the ground pad region 583, the ground pad region 584 and the ground pad region 586 can electrically connected to the ground connecting terminal 622, the ground connecting terminal 626 of the DUT 62 and the ground point. As a result, the probes of the probe card can contact the signal pad region 582, the signal pad region 585, the ground pad region 581, the ground pad region 583, the ground pad region 584 and the ground pad region 586 to test the DUT 62.

Figure 6:
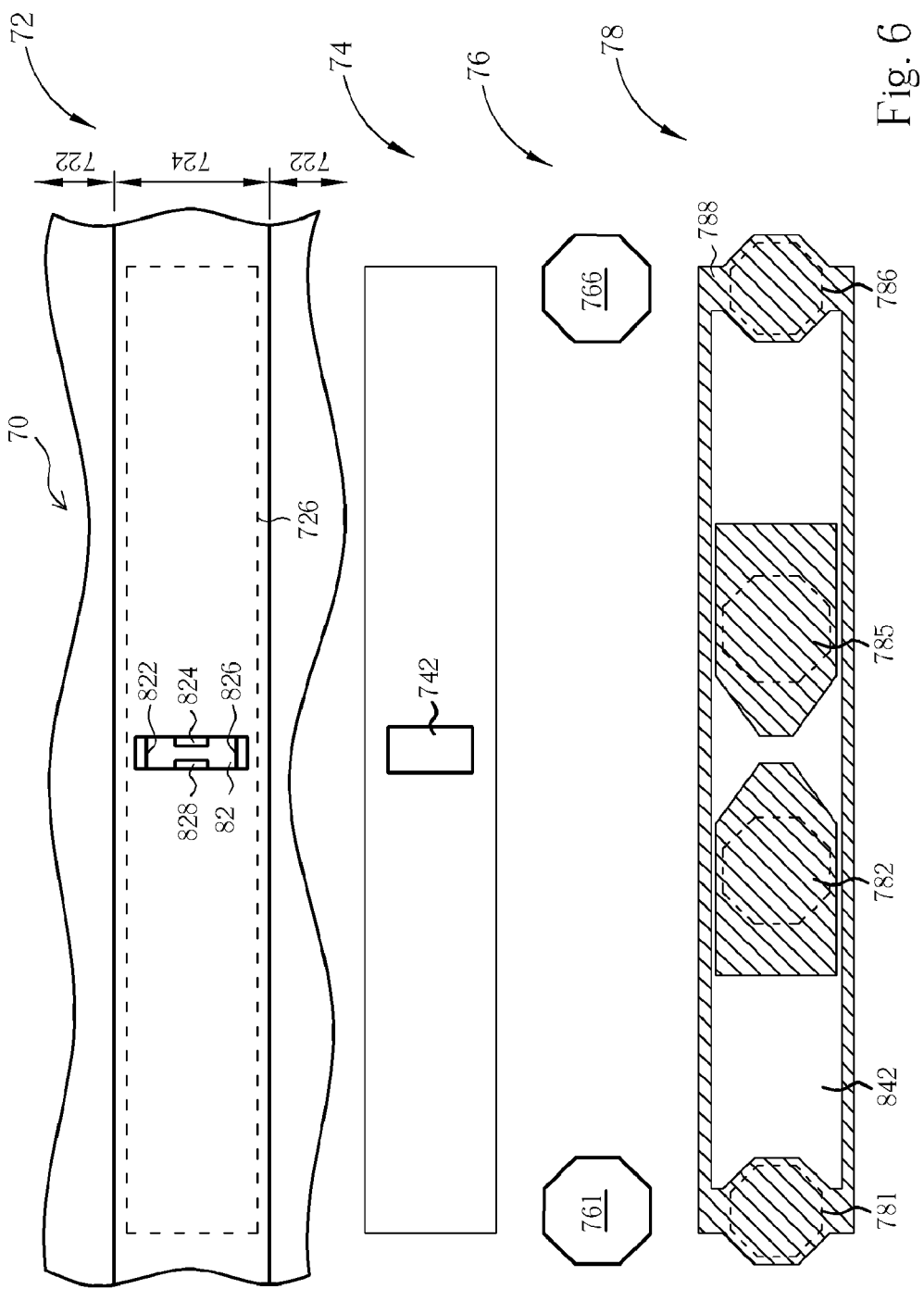
FIG. 6 illustrates a schematic diagram of a layout of a RF test key structure according to a third preferred embodiment of the present invention.

Please refer to FIG. 6. FIG. 6 illustrates a schematic diagram of a layout of a RF test key structure according to a third preferred embodiment of the present invention. As shown in FIG. 6, the RF test key structure 70 from bottom to top includes a substrate 72, a bottom metal layer 74, at least an inner metal layer 76 and a top metal layer 78. The substrate 72 can be a semiconductor wafer, and a plurality of die regions 722 and at least a scribe line region 724 between the die regions 722 are defined in the substrate 72. A narrow testing region 726 is defined in the scribe line region 724 of the substrate 72, and is set as a predetermined position for the RF test key structure 70.

The narrow testing region 726 of the substrate 72 can further include a device under test (DUT) 82. The DUT 82 can be a RF component, such as a MOS transistor or an equivalent circuit of a MOS transistor. The DUT 82 includes a ground connecting terminal 822 in the front, a signal connecting terminal 824 to the right, a ground connecting terminal 826 in the rear and a signal connecting terminal 828 to the left. The ground connecting terminal 822 is electrically connected to a source of the DUT 82, the signal connecting terminal 824 is electrically connected to a drain of the DUT 82, the ground connecting terminal 826 is electrically connected to the substrate of the DUT 82, and the signal connecting terminal 828 is electrically connected to a gate of the DUT 82.

The bottom metal layer 74, which can be electrically connected to a ground point (not shown in the figure), is substantially a narrow rectangular metal piece positioned in the narrow testing region 726 on the substrate 72. The bottom metal layer 74 includes a containing opening 742 to expose the signal connecting terminal 824 and the signal connecting terminal 828 of the DUT 82. Furthermore, the bottom metal layer 74 contacts the ground connecting terminal 822 and the ground connecting terminal 826 so as to electrically connect to the source of the DUT 82 and the substrate 72.

The top metal layer 78 is a metal pad in a sheet form, and substantially a narrow rectangular metal piece positioned in the narrow testing region 726 on the bottom metal layer 74. In this preferred embodiment, two signal pad regions 782, 785 and two ground pad regions 781, 786 are defined in the top metal layer 78, and arranged in one row parallel to the narrow testing region 726. The signal pad regions 782, 785 and the ground pad regions 781, 786 are a ground pad region 781, a signal pad region 782, a signal pad region 785, and a ground pad region 786 arranged from left to right (G-S-S-G) for electrically connecting to the testing probes. Please note that the octagonal signal pad regions 782, 785 and the octagonal ground pad regions 781, 783, 784, 786 are just taken as an example. The shapes of the signal pad regions 782, 785 and the ground pad regions 781, 783, 784, 786 can be any geometric shape, such as rectangles, hexagons, octagons, or circles.

The top metal layer 78 comprises at least an insulating opening between the signal pad regions 782, 785 and the ground pad regions 781, 786 and between the two signal pad regions 782, 785 so as to separate the signal pad regions 782, 785 from the ground pad regions 781, 786 and to separate the signal pad regions 782, 785 from each other. For instance, the top metal layer 78 includes an insulating opening 842 extensively surrounding the signal pad regions 782, 785. The insulating opening 842 can electrically separate the ground pad region 781 from the signal pad region 782, electrically separate the ground pad region 781 from the signal pad region 785, electrically separate the ground pad region 786 from the signal pad region 782, and electrically separate the ground pad region 786 from the signal pad region 785 in the top metal layer 78. Besides, the insulating opening 842 turns an edge of the top metal layer 78 into a frame structure 788, and the ground pad region 781 and the ground pad region 786 are electrically connected to each other through the frame structure 788. Because parts of the top metal layer 78 adjacent to the DUT 82 get narrow gradually from an edge of the top metal layer 78 to the DUT 82, the present invention increases the accuracy of the RF test key structure 70 in test.

A piece 761 and a piece 766 are included in the inner metal layer 76, and corresponding to the ground pad region 781 and the ground pad region 786 of the top metal layer 78 respectively. Above the inner metal layers 76, the piece 761 and the piece 766 are electrically connected to the ground pad region 781 and the ground pad region 786 of the top metal layer 78 respectively through a plurality of via plugs (not shown in the figure). Below the inner metal layers 76, the piece 761 and the piece 766 are electrically connected to the bottom metal layer 74 through a plurality of via plugs (not shown in the figure). Besides the piece 761 and the piece 766, the inner metal layer 76 can further include a frame (not shown in the figure). The frame can be set corresponding to the frame structure 788 of the top metal layer 78, and provides a better protection for the RF test key structure 70. The piece 761, the piece 766 and the frame 768 can be made of metal.

Thereafter, the signal pad region 782 and the signal pad region 785 can be electrically connected to the signal connecting terminal 824 and the signal connecting terminal 828 of the DUT 82 respectively through the top metal layer 78, and the ground pad region 781 and the ground pad region 786 can be electrically connected to the ground connecting terminal 822, the ground connecting terminal 826 of the DUT 82 and the ground point. As a result, the probes of the probe card can contact the signal pad region 782, the signal pad region 785, the ground pad region 781 and the ground pad region 786 to test the DUT 82.

Moreover, the RF test key structure of the present invention can be in different forms so as to be applied to different DUT and different probe card. Followings are some examples of the RF test key structure:

(1) A fourth preferred embodiment: a RF test key structure includes two signal pad regions and two ground pad regions. The two signal pad regions and the two ground pad regions are a signal pad region, a ground pad region, a ground pad region and a signal pad region arranged from left to right (S-G-G-S).

(2) A fifth preferred embodiment: a RF test key structure includes two signal pad regions and two ground pad regions. The two signal pad regions and the two ground pad regions are a signal pad region, a ground pad region, a signal pad region and a ground pad region arranged from left to right (S-G-S-G).

(3) A sixth preferred embodiment: a RF test key structure includes two signal pad regions and three ground pad regions. The two signal pad regions and the three ground pad regions are a ground pad region, a signal pad region, a ground pad region, a signal pad region and a ground pad region arranged from left to right (G-S-G-S-G).

It should be noted that other testing components could be applied to the RF test key structures instead of the DUTs shown in the above-mentioned embodiments. For example, the DUTs can be replaced by an open component, a short component, or a through component. The four edges of the open component, the short component, or the through component include four connecting terminals for electrically connecting to the signal pad regions and the ground pad regions of the RF test key structure. However, the four connecting terminals do not electrically connect to each other in the open component so to form a broken circuit. For the short component, the four connecting terminals are directly electrically connected to each other through connecting lines so to form a short circuit. For the through component, two of the connecting terminals that electrically connect to the signal pad regions of the RF test key structure are directly electrically connected to each other through a connecting line, and two of the connecting terminals that electrically connect to the ground pad regions of the RF test key structure are not electrically connected to each other.

For instance, as a MOS transistor should be tested, a RF test key structure including the MOS transistor and a RF test key structure including a short component are formed. Subsequently, the RF test key structure including the MOS transistor and the RF test key structure including a short component are tested utilizing the probes. Next, the testing data of the two RF test key structures are compared and calculated so that the electrical characteristic of the MOS transistor is obtained.

Because the signal pad regions and the ground pad regions of the top metal layer are arranged in one row parallel to the narrow testing region, the RF test key structure can be set in the scribe line region. Thereafter, the test can be performed during the manufacturing processes, and the RF test key structure does not take space from the die regions.

Furthermore, because the signal pad regions are electrically connected to the DUT through the top metal layer with large area, the present invention can get the accurate test data of a RF component (DUT) utilizing the RF test key structure, prevent the RF test key structure from changing the electrical characteristic of the DUT, and increase the accuracy of the RF test key structure.

On the other hand, because the bottom metal layer, the inner metal layer and the top metal layer are electrically connected to each other, and all electrically connected to a ground point, the RF test key structure forms a three-dimensional electromagnetic interference shielding. Since the top metal layer and the bottom metal layer of the RF test key structure both are metal layers with large area, and the top metal layer includes a frame structure to insulate the outer RF, the present invention provides a great electromagnetic interference shielding to protect the RF test key structure from the outer RF interference, and increase the accuracy of the RF test key structure. It deserves to be mentioned that, the inner metal layers are optional components. In other words, the RF test key structure of the present invention can include no inner metal layer. Instead, the ground pad regions of the top metal layer are electrically connected to the bottom metal layer by a plurality of via plugs, and form a three-dimensional electromagnetic interference shielding.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency test key structure positioned in a scribe line region comprising:
   a substrate, at least a scribe line region being defined in the substrate;
   a device under test positioned in the scribe line region on the substrate, comprising at least two signal connecting terminals and at least two ground connecting terminals; and
   at least two metal layers positioned in the scribe line region, the metal layers comprising a bottom metal layer positioned on the substrate and a top metal layer positioned on the bottom metal layer, the top metal layer being a metal pad in a sheet form, at least two signal pad regions and at least two ground pad regions being defined in the top metal layer, the signal pad regions being electrically connected to the signal connecting terminals of the device under test through the top metal layer, the ground pad regions being electrically connected to the ground connecting terminals of the device under test, the signal pad regions and the ground pad regions being arranged in one row, the row being parallel to the scribe line region, the top metal layer comprising at least an insulating opening between the signal pad regions and the ground pad regions and between the two signal pad regions so as to separate the signal pad regions from the ground pad regions and to separate the signal pad regions from each other, and the insulating opening narrows parts of the top metal layer adjacent to the device under test gradually from an edge of the top metal layer to the device under test.

2. The radio frequency test key structure of claim 1, wherein the signal pad regions and the ground pad regions are in an arrangement where one of the signal pad region, one of the ground pad region, the other signal pad region, and the other ground pad region are arranged from left to right.

3. The radio frequency test key structure of claim 1, wherein the signal pad regions and the ground pad regions are in an arrangement where one of the signal pad region, one of the ground pad region, the other ground pad region, and the other signal pad region are arranged from left to right.

4. The radio frequency test key structure of claim 1, wherein the signal pad regions and the ground pad regions are in an arrangement where one of the ground pad region, one of the signal pad region, the other signal pad region, and the other ground pad region are arranged from left to right.

5. The radio frequency test key structure of claim 1, wherein two signal pad regions and three ground pad regions are defined in the top metal layer, and the signal pad regions and the ground pad regions are in an arrangement where one of the ground pad region, one of the signal pad region, one of the other ground pad region, the other signal pad region, and the other ground pad region are arranged from left to right.

6. The radio frequency test key structure of claim 1, wherein two signal pad regions and four ground pad regions are defined in the top metal layer, and the signal pad regions and the ground pad regions are in an arrangement where one of the ground pad region, one of the signal pad region, one of the other ground pad region, one of the other ground pad region, the other signal pad region, and the other ground pad region are arranged from left to right.

7. The radio frequency test key structure of claim 6, wherein the four ground pad regions are a marginal ground pad region, a central ground pad region, a central ground pad region, and a marginal ground pad region from left to right, the top metal layer comprises three insulating openings in total, two of the insulating openings surround the two central ground pad regions respectively, the other insulating opening surrounds the signal pad regions and the central ground pad regions, and crosses in a position between the central ground pad regions.

8. The radio frequency test key structure of claim 1, wherein the ground pad regions are electrically connected to the ground connecting terminals of the device under test through a plurality of via plugs and the bottom metal layer.

9. The radio frequency test key structure of claim 1, wherein the top metal layer comprises a frame structure, and the ground pad regions are electrically connected to each other through the frame structure of the top metal layer.

10. The radio frequency test key structure of claim 1, wherein the bottom metal comprises a narrow rectangular metal piece.

11. The radio frequency test key structure of claim 1, wherein the metal layers comprises at least an inner metal layer positioned between the top metal and the bottom metal layer, and the inner metal layer electrically connects the ground pad regions and the bottom metal layer.

12. The radio frequency test key structure of claim 1, wherein the insulating opening extents partially to surround each of the signal pad regions.

13. A radio frequency test key structure comprising:
    a substrate, a narrow testing region being defined in the substrate;
    a device under test positioned in the narrow testing region on the substrate;
    a bottom metal layer positioned in the narrow testing region on the substrate, comprising a containing opening to expose parts of the device under test; and
    a top metal layer positioned in the narrow testing region on the bottom metal layer, the top metal layer being a metal pad in a sheet form, at least two signal pad regions and at least two ground pad regions being defined in the top metal layer, the signal pad regions of the top metal layer are electrically connected to the device under test through the top metal layer, the signal pad regions and the ground pad regions being arranged in one row, the row being parallel to the narrow testing region, the ground pad regions being electrically connected to the bottom metal layer, the top metal layer comprising at least an insulating opening between the signal pad regions and the ground pad regions and between the two signal pad regions so as to separate the signal pad regions from the ground pad regions and to separate the signal pad regions from each other, and the insulating opening narrows parts of the top metal layer adjacent to the device under test gradually from an edge of the top metal layer to the device under test.

14. The radio frequency test key structure of claim 13, wherein the signal pad regions and the ground pad regions are in an arrangement where one of the signal pad region, one of the ground pad region, the other signal pad region, and the other ground pad region are arranged from left to right.

15. The radio frequency test key structure of claim 13, wherein the signal pad regions and the ground pad regions are in an arrangement where one of the signal pad region, one of the ground pad region, the other ground pad region, and the other signal pad region are arranged from left to right.

16. The radio frequency test key structure of claim 13, wherein the signal pad regions and the ground pad regions are in an arrangement where one of the ground pad region, one of the signal pad region, the other signal pad region, and the other ground pad region are arranged from left to right.

17. The radio frequency test key structure of claim 13, wherein two signal pad regions and three ground pad regions are defined in the top metal layer, and the signal pad regions and the ground pad regions are in an arrangement where one of the ground pad region, one of the signal pad region, one of the other ground pad region, the other signal pad region, and the other ground pad region are arranged from left to right.

18. The radio frequency test key structure of claim 13, wherein two signal pad regions and four ground pad regions are defined in the top metal layer, and the signal pad regions and the ground pad regions are in an arrangement where one of the ground pad region, one of the signal pad region, one of the other ground pad region, one of the other ground pad region, the other signal pad region, and the other ground pad region are arranged from left to right.

19. The radio frequency test key structure of claim 18, wherein the four ground pad regions are a marginal ground pad region, a central ground pad region, a central ground pad region, and a marginal ground pad region from left to right, the top metal layer comprises three insulating openings in total, two of the insulating openings surround the two central ground pad regions respectively, the other insulating opening surrounds the signal pad regions and the central ground pad regions, and crosses in a position between the central ground pad regions.

20. The radio frequency test key structure of claim 13, wherein the ground pad regions are electrically connected to the device under test through a plurality of via plugs and the bottom metal layer.

21. The radio frequency test key structure of claim 13 comprising at least an inner metal layer positioned between the top metal and the bottom metal layer, and the inner metal layer electrically connects the ground pad regions and the bottom metal layer.

22. The radio frequency test key structure of claim 13, wherein the ground pad regions and the bottom metal layer are electrically connected to a ground point so that the top metal layer and the bottom metal layer form an electromagnetic interference shielding.

23. The radio frequency test key structure of claim 22, wherein the top metal layer comprises a frame structure, the ground pad regions are electrically connected to each other through the frame structure of the top metal layer, and the frame structure of the top metal layer and the bottom metal layer form the electromagnetic interference shielding.

24. The radio frequency test key structure of claim 13, wherein the insulating opening extents partially to surround each of the signal pad regions.

* * * * *